United States Patent [19]

Piret et al.

[11] Patent Number: 4,486,882

[45] Date of Patent: Dec. 4, 1984

[54] SYSTEM FOR TRANSMITTING BINARY DATA VIA A PLURALITY OF CHANNELS BY MEANS OF A CONVOLUTIONAL CODE

[75] Inventors: Philippe M. O. A. Piret, Brussels, Belgium; Thijs Krol, Eindhoven, Netherlands

[73] Assignee: U.S. Philips Corporation, New York, N.Y.

[21] Appl. No.: 412,066

[22] Filed: Aug. 27, 1982

[30] Foreign Application Priority Data

Sep. 9, 1981 [BE] Belgium .................................. 205909

[51] Int. Cl.³ .............................................. G06F 11/10
[52] U.S. Cl. ..................................................... 371/45
[58] Field of Search .............................. 371/44, 45, 43

[56] References Cited

U.S. PATENT DOCUMENTS

3,566,352  2/1971  Massey .................................... 371/45
3,697,947  10/1972  Macy ....................................... 371/45
4,395,768  7/1983  Goethals et al. ...................... 371/45

Primary Examiner—Charles E. Atkinson
Attorney, Agent, or Firm—Jack E. Haken; James J. Cannon, Jr.

[57] ABSTRACT

A system for correcting multiple simultaneously erroneous channels within a plurality of parallel data channels including redundant channels. At the receiving side a group of syndrome generators each applies a secondary parity check matrix for producing corresponding groups of syndrome bit streams. If the error is correctable, one or more of the syndrome bit streams is added to corresponding code bit streams. If a syndrome bit stream indicates an error in a non-applicable code bit channel, or otherwise indicates too many errors, it remains unused. Decoders with feedback (restoration of syndromes after correction) and feedback-free decoders are possible.

6 Claims, 15 Drawing Figures $$\begin{pmatrix} c_1(D) \\ c_1(D) \\ c_3(D) \\ \vdots \\ c_n(D) \end{pmatrix} = \begin{pmatrix} g_{1,1}(D) & g_{1,2}(D) & \cdots & g_{1,k}(D) \\ g_{2,1}(D) & g_{2,2}(D) & & g_{2,k}(D) \\ \vdots & \vdots & & \vdots \\ g_{n,1}(D) & g_{n,2}(D) & \cdots & g_{n,k}(D) \end{pmatrix} \times \begin{pmatrix} d_1(D) \\ d_2(D) \\ \vdots \\ d_k(D) \end{pmatrix}$$

FIG.1

$$\begin{pmatrix} 1 & 1 & 1 & 1 & \cdots & 1 \\ 1 & a^1 & a^2 & a^3 & & a^{n-1} \\ 1 & a^2 & a^4 & a^6 & & a^{2(n-1)} \\ 1 & a^3 & a^6 & a^9 & & \vdots \\ \vdots & & & & & \vdots \\ 1 & a^s & a^{2s} & a^{3s} & \cdots & a^{s(n-1)} \end{pmatrix}$$

$$[G(D)] = \begin{pmatrix} 1 & 1 & 1 \\ 1 & 0 & 0 \\ 0 & 1 & 0 \\ D^2+D & D^2 & D+1 \\ D^2+D+1 & D^2 & D \\ 0 & 0 & 1 \\ D^2+D+1 & D^2+1 & D+1 \end{pmatrix}$$

$$[H(D)] = \begin{pmatrix} 1 & 1 & 1 & 0 & 0 & 1 & 0 \\ 0 & D^2+D & D^2 & 1 & 0 & D+1 & 0 \\ 0 & D^2+D+1 & D^2 & 0 & 1 & D & 0 \\ 0 & D^2+D+1 & D^2+1 & 0 & 0 & D+1 & 1 \end{pmatrix}$$

$$[G(D)] = \begin{pmatrix} 1 & 0 & 0 & 0 \\ 0 & 1 & 0 & 0 \\ 0 & 0 & 1 & 0 \\ 0 & 0 & 0 & 1 \\ D^3+D+1 & D^3+D^2+1 & D^2 & D^2+1 \\ D^3 & D^3+D^2+D+1 & D^2+1 & D^2 \\ D^3+1 & D^3+D+1 & D^4+D+1 & D^4+D^3+D+1 \\ D^2 & D^2+1 & D^4+D^3+D^2 & D^4+D+1 \end{pmatrix}$$

FIG.7

$$[H(D)] = \begin{pmatrix} 1 & 0 & 0 & 0 & D^3+D+1 & D^3+D^2+1 & D^2 & D^2+1 \\ 0 & 1 & 0 & 0 & D^3 & D^3+D^2+D+1 & D^2+1 & D^2 \\ 0 & 0 & 1 & 0 & D^3+1 & D^3+D+1 & D^4+D+1 & D^4+D^3+D+1 \\ 0 & 0 & 0 & 1 & D^2 & D^2+1 & D^4+D^3+D^2 & D^4+D+1 \end{pmatrix}$$

$$H_1(D) = \begin{vmatrix} 1 & 0 & 0 & 0 & 13 & 15 & 4 & 5 \\ 0 & 1 & 0 & 0 & 10 & 17 & 5 & 4 \\ 0 & 0 & 1 & 0 & 11 & 13 & 23 & 33 \\ 0 & 0 & 0 & 1 & 4 & 5 & 34 & 23 \end{vmatrix}$$

$$H_2(D) = \begin{vmatrix} 721 & 622 & 16 & 5 & 1 & 0 & 0 & 0 \\ 663 & 747 & 15 & 4 & 0 & 1 & 0 & 0 \\ 1531 & 1770 & 33 & 10 & 0 & 0 & 1 & 0 \\ 1115 & 1201 & 23 & 17 & 0 & 0 & 0 & 1 \end{vmatrix}$$

$$H_3(D) = \begin{vmatrix} 1 & 0 & 23 & 40 & 0 & 0 & 1201 & 1770 \\ 0 & 1 & 24 & 57 & 0 & 0 & 1115 & 1531 \\ 0 & 0 & 5 & 13 & 1 & 0 & 233 & 332 \\ 0 & 0 & 4 & 11 & 0 & 1 & 260 & 347 \end{vmatrix}$$

$$H_4(D) = \begin{vmatrix} 73 & 63 & 1 & 0 & 4 & 5 & 0 & 0 \\ 57 & 40 & 0 & 1 & 15 & 16 & 0 & 0 \\ 4 & 5 & 0 & 0 & 4 & 7 & 1 & 0 \\ 5 & 4 & 0 & 0 & 7 & 5 & 0 & 1 \end{vmatrix}$$

$$H_5(D) = \begin{vmatrix} 1 & 0 & 40 & 63 & 747 & 622 & 0 & 0 \\ 0 & 1 & 57 & 73 & 663 & 721 & 0 & 0 \\ 0 & 0 & 23 & 33 & 347 & 332 & 1 & 0 \\ 0 & 0 & 34 & 23 & 260 & 233 & 0 & 1 \end{vmatrix}$$

$$H_6(D) = \begin{vmatrix} 57 & 40 & 1 & 0 & 0 & 0 & 17 & 10 \\ 24 & 23 & 0 & 1 & 0 & 0 & 23 & 33 \\ 17 & 15 & 0 & 0 & 1 & 0 & 5 & 7 \\ 10 & 13 & 0 & 0 & 0 & 1 & 7 & 4 \end{vmatrix}$$

SYSTEM FOR TRANSMITTING BINARY DATA VIA A PLURALITY OF CHANNELS BY MEANS OF A CONVOLUTIONAL CODE

BACKGROUND OF THE INVENTION

1. Field of the Invention

The invention relates to a system for introducing redundant binary data in a plurality of parallel serial streams into a medium, and for extracting those binary data again, where the redundancy allows for correcting certain types of data errors. The medium may be a material that is locally magnetizable, or that may locally be modified by optical, for example laser, means and which is driven along a write/read device.

In this case "introduction" is to be understood to mean "writing" and "extracting" is to be understood to mean "reading". Alternatively a plurality of parallel data communication channels may be present. In that case, "introducing" relates to "transmission" and "extracting" relates to "reception".

2. Description of the Prior Art

A device of the described kind is known from U.S. Pat. No. 3,697,947. The known technique concerns three data channels and one error correction channel and is based on a convolutional code. The generation of the error correction bits is realized by means of EXCLUSIVE-OR logic or modulo-2 addition. An arbitrary error in a group of three parallel data bits can be corrected by the convolutional code used. Obviously, such mutilated three-bit characters must be spaced sufficiently apart. The invention, however, is based on the recognition of the fact that errors in many instances are limited to only a few data channels in each of which a string or errors may occur in quick succession. The known code does not offer a solution in this respect. A system for transmitting binary data via a plurality of channels in which an error string occurring in a single channel at a time would be rendered correctable by the addition of two redundant channels has been described in the U.S. Pat. No. 4,395,768 issued July 26, 1983, now abandoned to Jean M. E. B. Goethals et al and assigned to the assignee of the present application, herein incorporated by reference. However, this earlier application allows for correction of only a single erroneous channel at a time.

Introduction of more redundancy along the concept of the prior invention would not, in many cases, allow for an increased error correction capability.

SUMMARY OF THE INVENTION

It is an object of the present invention to provide a system comprising encoding and decoding devices based on a multiple-channel (n, k) convolutional code that allows for simultaneous correction of $t \geq 2$ erroneous channels. The invention realizes its object in that it is provided with the following elements:

a. a plurality of $k \geq 2$ data inputs for receiving in parallel successive groups of k input data bits each;

b. an encoding device comprising first multiplication means for multiplying the k streams of data bits with a generator matrix $[G(D)]$ of n rows by k columns, consisting of a (k×k) identity matrix and an (n−k)×k additional matrix, wherein all elements of $[G(D)]$ are polynominals in D, the delay operator of a length of one bit cell, and are elements of a field F(D) consisting of all Laurent series having coefficients $a_i$, and wherein all elements of the additional matrix are non-zero and at least one thereof is a polynominal with at least two terms; wherein the generator matrix $[G(D)]$ is given by an (n×k) generator matrix of a minimum distance separable symbol correcting code defined in a Galois field $GF(2^m)$ in that the coefficients of the polynominal elements in $[G(D)]$ are the binary elements of the binary representation of the corresponding elements $a_i$ of the Galois field $GF(2^m)$ of the generator matrix of the minimum distance separable code, wherein $2^m \geq n-1$ and $a_i$ is an element of $GF(2^m)$; said encoding device having n outputs for outputting, synchronously with the reception of a group of k data bits, a corresponding group having k unmodified data bits to (n−k) redundant code bits to said medium.

An advantageous decoding device has means for implementing a parity check matrix $[H(D)]$ given by $[G(D)] \cdot [H(D)] = 0$ when all operations are executed in the field F(D), said decoding device comprising:

c. a plurality of B decoder modules each having respective second multiplication means for receiving said groups of n code bits in parallel for multiplying the received code bit stream by a respective secondary parity check matrix $[H_{1..b..B}(D)]$ of (n−k) rows by n columns, the result of each multiplication consisting in (n−k) parallel streams of syndrome bits, each of said (n−k) streams indicating a preliminary correction bit stream to an associated code bit channel while also corresponding to a respective one of the (n−k) rows, wherein the derivation of $[H_{1..b..B}(D)]$ from $[H(D)]$ is done as follows:

i. a set of B second elements is formed, each second element consisting of 2t channel indices, each combination of t channel indices being contained in at least one of said elements;

ii. for each of said second elements a first intermediate matrix is formed $[R_{1..b..B}(D)]$ consisting of only those columns of $[H(D)]$ that have indices equal to respective indices of code channels contained in said element;

iii. for each of said second elements a second intermediate matrix $[H^o{}_{1..b..B}(D)]$ is formed by:

$$[H^o{}_{1..b..B}(D)] = [R_{1..b..B}(D)]^{-1} [H(D)]$$

iv. for each of said second elements a matrix $[H_{1..b..B}(D)]$ is formed by:

$$[H_{i..b..B}(D)] = a_L (i\ D)\ [H^o{}_{1..b..B}(D)]$$

wherein $a_L(D)$ is the smallest common multiple of all the denominators of all matrix elements of all matrices $[H^o{}_{1..b..B}(D)]$, written as $a_L(D) = D^{-f} \cdot E(D)$ wherein f is the lowest power in D of $a_L(D)$ having a non-zero coefficient;

d. for each of said B decoder modules a shift register module of (n−k) bits wide for receiving said syndrome bit streams and storing a predetermined sequence length thereof;

e. for each of said shift register modules a syndrome detector for detecting and enumerating any non-zero syndrome bit sequence in the corresponding shift register and producing a gating signal under control of detection of (o...t) non-zero syndrome bit sequences but otherwise a blocking signal;

f. connected to an output of each of said shift register modules an (n−k) bit wide syndrome gate that is transmitting exclusively under control of the gating signal from the associated syndrome detector, but otherwise blocked, g. a cross-connection device for sorting the syndrome bit streams transmitted through said syndrome gates according to the corresponding one of said n code bit channels;

i. delay means associated with third multiplying means connected in parallel to said B decoder modules for receiving at least the non-redundant code bit streams from the medium and for introducing a delay that is equal to the delay incurred in said decoder modules and said shift register modules while also effecting a multiplication by the polynominal E(D);

j. EXCLUSIVE-OR means connected to outputs of said cross connection device and of said delay means associated with third multiplying means for correcting at least the non-redundant code bit streams with non-zero syndrome bit streams, and outputting the corrected code bit streams.

It should be noted that the required redundancy is less than the one used by triplication of the original data streams. There, for example $k=2$ and $n=6$, but the two correctable channels should correspond to different data channels. According to the present invention, in principle an arbitrary pair of erroneous channels would be correctable. Now the system recited hereabove is feedback-free. In certain cases, hardware savings may be realized by introducing feedback in the decoder device.

BRIEF DESCRIPTION OF THE FIGURES

Hereinafter, the invention will be described in several aspects. First a theoretical background will be provided. Next, elementary set-ups of an encoding and a decoding device will be treated. Finally, preferred embodiments of an encoder device and of a decoder device will be given, wherein one decoder incorporates a feedback mechanism and the other is feedback free. The description is illustrated by means of the following figures.

THEORETICAL BACKGROUND OF THE INVENTION

The invention is described by means of the well-known notation of a group of directly successive information bits on a one-bit-wide channel {$x_k, \ldots x_1, x_0$} by the polynominal in the delay operator D: {$x_k \cdot D^k + \ldots + x_2 D^2 + x_1 \cdot D^1 + x_0 \cdot D^0$}. The delay operator D is thus expressed as the length of one bit cell, while the bit $x_0$ occurs first in time. If a given bit is lacking (not taken into account), the corresponding power of the delay operator D is also lacking in the polynominal. The mathematical description is well-known in the art and has been published, for example, in the standard work "Error Correcting Codes", by W. W. Peterson and Weldon, MIT, Boston, 2nd edition 1971, notably on p. 393. A shortened notation of those polynominals is reached by the octal representation of the coefficients, starting from the highest power in D. Thus for example:

$x_5 \cdot D^5 + x_4 \cdot D^4 + x_3 \cdot D^3 + 0 + x_1 \cdot D^1 + 0$ is shortened into "111.010"="7.2".

Figure 1:
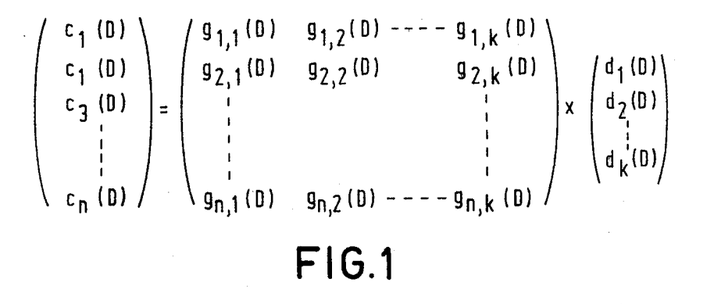
FIG. 1 shows the generation of a sequence of n-tuples of code-bits from a sequence of k-tuples of data bits.

In this respect FIG. 1 mathematically gives the generation of n-tuple of code-bit sequences $c_1(D) \ldots c_n(D)$ on the basis of a k-tuple of data bit sequences $d_1(D) \ldots d_k(D)$ by means of nxk (n>k) generator matrix G(D). Herein, each element $g_{i,j}$ of [G(D)] is a polynominal in D. A systematic code may be described by a generator matrix wherein $g_{i,i}=D^\circ=1$ and $g_{i,j}=0$ for $i \neq j$ and $i,j \leq k$. Note that no restrictions have been given for $i > k$. Usually, the hardware requirements for implementing a systematic code are less than those for implementing a non-systematic code. Now, if for example, $g_{1,2}(D)=1+D^2$, the code bit sequence $c_1(D)$ is produced from the data bit sequence $d_2(D)$ at the corresponding instance in time, and also on the same data bit sequence $d_2(D)$ which is, however, delayed by two time units or bit cells. To produce the actual code bit sequence all contributions thereto are added (modulo-2). It should be noted that the modulation of the code-bits for adaptation to the physical or other properties of the medium is not considered in the present disclosure. The successive n-tuples are a redundant representation of the k-tuples because n>k. Furthermore, in the following only the well-known case of linear codes is considered. Now the weight of a code sequence is defined as the number of non-zero bit sequences in the n-fold bit sequences constituting the code sequence. Note that the code sequence consists of n-tuples while the bit sequences are each one bit wide. Therein, any bit sequence that does not completely consist of zeroes increases the weight of the code sequence by one unit. The maximum weight of any code sequence is therefore equal to n. The exact content of a non-zero bit sequence is inconsequential to the determination of the weight. Generally, also a code sequence consisting exclusively of zero-bit sequences is a correct code sequence. The minimum Hamming weight of a code is now defined as the minimum number of non-zero bit sequences (except for the all-zero code sequence) that would yield a correct code sequence. The minimum weight is incurred within a finite length bit stream. Furthermore, the minimum Hamming distance dist (C) of a convolutional code generated by the generator matrix [G(D)] is the minimum weight of the difference between any two non-identical code sequences (n-tuple of code bit sequences).

If this distance is sufficiently large in principle a correction of bit errors may be effected. It may be proved, that the minimum Hamming weight of a code is equal to its minimum Hamming distance. Now an error in a finite length bit stream, wherein the minimum Hamming distance were incurred, may be corrected if the Hamming weight of the error is equal to or less than:

$$\{dist\ (C)\}/2$$

It should be noted that the distance between two sequences of n-tuples as defined hereabove will either remain constant or, otherwise, increase as a greater length of those sequences is considered. Furthermore, it may be proven, than an (n,k) convolutional code must satisfy:

$$dist\ (C) \leq (n-k+1)$$

Thus, for each channel, in which an arbitrary run of errors should be simultaneously correctable, at least two redundant channels are required. Note that in principle the combination of erroneous channels may be arbitrary. Now, in the following the construction of the code for correcting simultaneously erroneous channels is done by starting with minimum distance separable (MDS) codes, many of which have been described earlier in the standard books on the art of error correcting, and reference is had again to the cited book by Peterson and Weldon.

Figure 2:
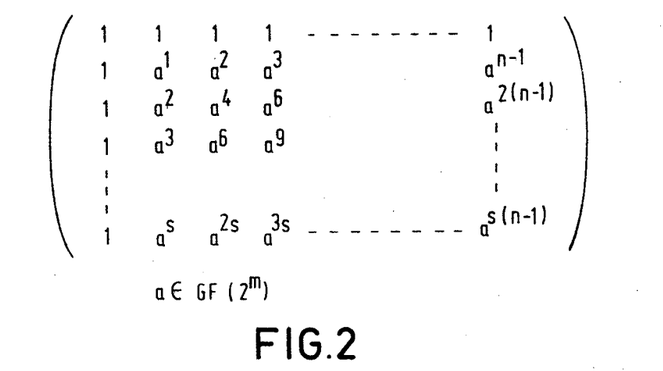
FIG. 2 gives an applicable parity check matrix.

Generally, linear error correction codes are analyzed along the properties of their parity check matrix which is used for reconstructing the non-redundant data from the redundant code bit stream(s). The connection between generator matrix [G] and parity check matrix [H] is that $[G] \cdot [H] = 0$. First we will describe the parity check matrix of a well known symbol correcting MDS code, as for example described in the standard work on this field "Error Correcting Codes" by MacWilliams and Sloane, see Chapter 11. It will be shown thereafter how the parity check matrix to be used for the multiple channel error correcting code is derived from the known matrix. Other codes having the required error correcting capability may be derived from different MDS codes. Now, FIG. 2 gives such a parity check matrix of dimensions (s+1)xn. All elements of this matrix are multibit symbols that are contained in the Galois Field $GF(2^m)$ wherein m is the bit length of the symbol. This Galois Field has $2^m$ elements for which the operations addition and multiplication have been defined to yield result elements within the same finite field, see e.g. T. C. Bartee et al, Information and Control, Vol. 6 (1963) pp. 79–98. Also, each element of this field has unique additive and multiplicative inverse elements, while the field contains a unique element 1 and a unique element 0. All elements of the field may be expressed as a power series of the so-called primitive element of the field. Specific properties of the exemplary matrix are that all elements of the first row are equal to $a^0 = 1$, whereas all elements of the second row are mutually different. The elements of column j are respectively equal to $a^0 = 1, a^j, a^{2j}\ldots$. Furthermore, every selection of (s+1) columns yields a non-singular square matrix. Now, each power $a^i$ may be written as:

$$a^i = D^i\ mod\ \pi(D),$$

wherein $\pi(D)$ is an irreducible polynomial in D to be specified later in an example: it has no divisor that is again a polynominal (in D) of lower, non-zero, degree. Tables of such primitive and irreducible polynominals are given in the book by Peterson and Weldon. If the degree of $\pi(D)$ is larger than 2, more than one polynominal would satisfy the requirements.

Now the parity check matrix [H] mentioned earlier may be multiplied at the left hand side by any non-singular square (s+1)x(s+1) matrix [S], whose elements are elements of the Galois Field $GF(2^m)$. The multiplication is executed according to [S]x[H], wherein all computations are executed in the Galois Field $GT\ (2^m)$, to produce a new parity check matrix. However, this new parity check matrix relates to exactly the same code (set of code words) as the old parity check matrix [H].

Alternatively, matrix [H] may be considered as relating to a field F(D), which means that all elements of [H] are also elements of F(D). The field F(D) is defined as consisting of the set of all Laurent series expressed in the delay operator D according to:

$$\sum_{i=k}^{\infty} a_i \cdot D^i$$

Consequently, the Laurent series is a representation of a semi-infinite stream of p-tuples of bits, provided that $p \leq 2^m$. Herewith the transition from symbol (= element of the matrices)-correcting code to multiple channel correcting code is made because all elements of the parity check matrix directly relate to a semi-infinite stream of p-tuples. The consequences of the above for the properties of the latter code are explained in the following. Now, in this field, F(D) addition and multiplication are similarly defined as for the Galois field $GF(2^m)$. For example, the irreducible polynominal be $\pi(D) = (x^4 + x + 1)$. Now, for example, addition of $(x^3 + 1)$ and $(x + 1)$ yields:

$$\left. \begin{array}{l} \text{in } GF\ (2^4):\ (x^3 + 1) + (x + 1) = x^3 + x \\ \text{in } F(D):\ (x^3 + 1) + (x + 1) = x^3 + x \end{array} \right\}\ \text{indentical results}$$

Contrariwise for example, multiplication of $(x^3 + 1)$ and $(x + 1)$ yields:

$$\text{in } GF(2^4):\ (x^3 + 1) \cdot (x + 1) = \underbrace{x^4 + x + 1}_{\pi(D)} + x^3 = x^3$$

$$\text{in } F(D):\ (x^3 + 1) \cdot (x + 1) = x^4 + x^3 + x + 1$$

Therefore, multiplication may produce different results in the fields $GF(2^4)$ and in F(D).

Now, the matrix [H], the elements whereof were considered of elements of $GF(2^m)$ has the property that any selection of (s+1) columns produces a non-singular, square matrix.

If now the elements of [H] are considered as being elements of F(D), the matrix has this same property to produce non-singular, square matrices, because any sequence of operations executed in F(D) on a set of elements may be translated to the same sequence of operations on the same elements on $GF(2^m)$ by taking all results of the operations in F(D) modulo the polynominal $\pi(D)$. This has been demonstrated herebefore for multiplication and addition; no further operations are necessary. Now, if a result of such operation is zero in F(D) it will also be zero in GF($2^m$). Conversely, if it is non-zero in GF($2^m$) it will also be non-zero in F(D).

Thus, also in the second case the parity check matrix may be multiplied at the left hand side by any non-singular square (s+1)x(s+1) matrix, to produce a new parity check matrix. In order that the new parity check matrix relate to exactly the same code all operations must be executed in the above mentioned field F(D). Now, in the field GF($2^m$) the parity check matrix [H] relates to a finite number of m-bit symbols. In the field F(D) the parity check matrix [H] relates to a number of in principle infinitely long bit streams. The transition from GF($2^m$) to F(D) is advantageously made when [H] has been transformed (or reduced) to a "diagonal" matrix of (n−k)x(n) elements. This diagonal matrix has in each of (n−k) columns only one element $a^o=1$ different from zero: each of those (n−k) columns has this element "1" on a respective different row. The reduction is effected by adding or subtracting rows and/or columns, modulo the irreducible, fixed, polynominal $\pi(D)$.

Thereafter, the parity check matrix [H(D)] may be converted to:

$$[H(D)] = [I(D) H^*(D)],$$

which means that the right hand side of the equation contains a "true" diagonal matrix I(D) of (n−k)x(n−k) elements, while further k columns of (n−k) row elements constitute a partial matrix [H*(D)]. Now, the generator matrix [G(D)] may be written as follows:

$$[G(D)] = \begin{bmatrix} -H^*(D) \\ I(D) \end{bmatrix} = \begin{bmatrix} H^*(D) \\ I(D) \end{bmatrix}$$

which means that the right hand side of the equation contains a true diagonal matrix [I(D)] of kxk elements, while the upper (n−k) rows are constituted by exactly the same matrix [H*(D)] discussed earlier. The above applies because [G(D)]·[H(D)]=0 where all operations are done in the field F(D). If the matrix [H(D)] is not written in this simplified form (i.e. not consisting of two juxtaposed sub-matrices, one a true diagonal submatrix), the index number in the series of columns of such column of matrix [H(D)] having more than one non-zero element corresponds to the index number in the series of rows of the identical row of the matrix [G(D)] (having again more than one non-zero element). The further columns of [H(D)] then have only one non-zero element. In this way the algorithm for calculating [G(D)] from parity check matrix [H(D)] is elementary.

Now, a theoretical background of the decoding is presented. The number of simultaneously correctable channels is equal to t (t≥2), wherein 2t≤(n−k). From the number of channels (n) a set of B members is formed, wherein each member consists of (n−k) channels, while each different combination of t channels is contained in at least one member of the set. Each single channel would generally be contained in more than one member of the set. The implementation of each member of the set requires a certain amount of hardware and, therefore, the minimization of the number of members offers savings; the number of different members that could in principle be in the set is equal to (n/n−k).

In practice, far fewer members of this set need to be implemented because every member would cover a rather large number of combinations of t channels. As will be seen later, for n=8 and 2t=k=4, the set comprises only six members, whereas $$\binom{n}{k} = \binom{n}{n-k} = 70.$$

The number B is called the cardinal number. Next, for each member (1..b..B) of the set a corresponding matrix [$R_b(D)$] is defined consisting of only those columns of the parity check matrix [H(D)] that have an index equal to an index of one of the t channels in the combination, out of the set of n channels. It is found that the matrix [$H_b{}^o(D)$]=[$R_b(D)$]$^{-1}$ [H(D)], of the same dimensions as H(D) now contains an identity matrix of (n−k)x(n−k) elements. As stated before, this produces an elementary relationship between matrices [G(D)] and [H(D)], while also the implementation of such "1"-elements is simple. Now, however, in many cases, one or more matrix elements of the set of B matrices [$H_b{}^o(D)$] may be fractional, i.e. the quotient of two mutually indivisible polynominals of finite degree: sometimes, however, all elements are elementary polynominals (thus, the denominators would be equal to 1). Now, the following quantity is defined: $a_L(D)$ is the smallest common multiple of all the denominators of all elements of all matrices [$H_b{}^o(D)$] of the specified set of matrices required for implementing the relevant code. Generally, $a_L(D)$ is an indivisible polynominal in D, but in certain cases it is found $a_L(D)=1$. The decoding now is implemented more simply by using a set of B modified secondary parity check matrices for checking the parity during decoding:

$$[H_b(D)] = a_L(D) \cdot [H_b{}^o(D)]$$

For this multiplication a correction must be introduced, which is most simply effected as a pre-encoding step before the encoding. It is defined as follows:

$$E(D) = D^{-f} \cdot a_L(D).$$

wherein f=delay {$a_1(D)$}, i.e. the lowest power in D in $a_1(D)$ having a non-zero-coefficient. The data received for encoding is now pre-encoded by means of conventional long division by E(D) for each channel. Alternatively, this division process may be included in the encoding step. Alternatively this pre-encoding may be omitted, but then the decoder must comprise a feedback loop; this is considered later on.

At the decoder, for each of the members of the set of secondary parity check matrices [$H_b(D)$] the syndrome sequence is generated. For correcting an error, one or more of the syndromes are selected.

ELEMENTARY DESCRIPTION OF ENCODING AND DECODING DEVICES

Figure 3:
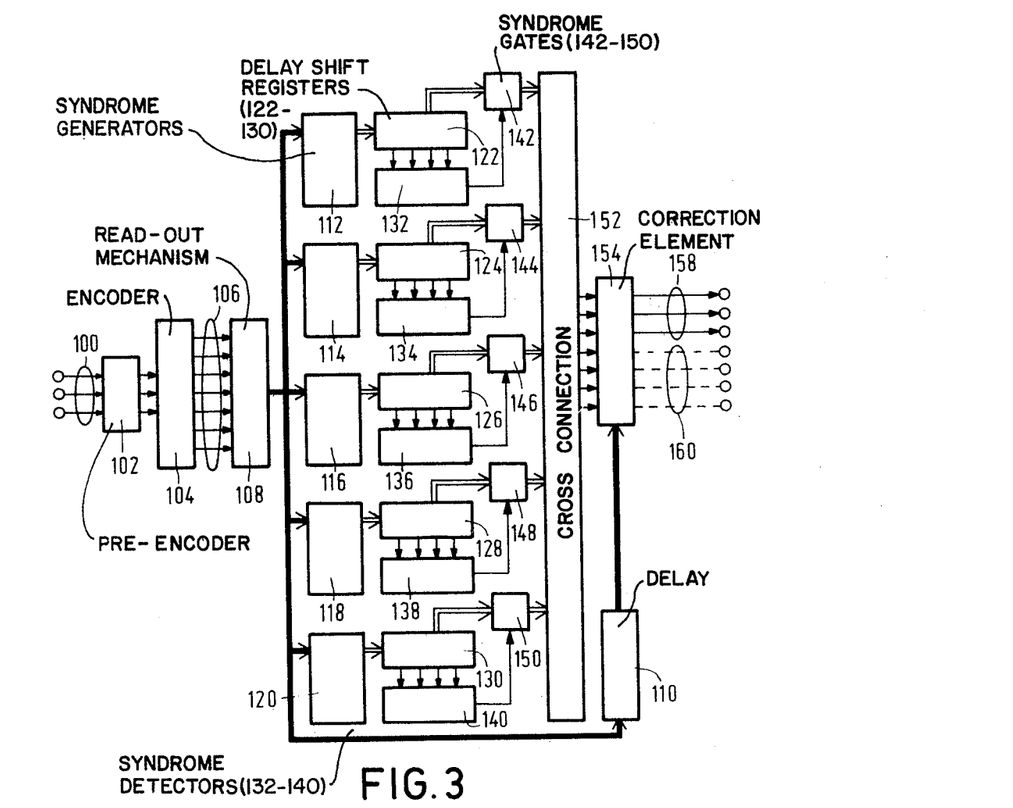
FIG. 3 shows an elementary diagram of an encoding and decoding device.

FIG. 3 shows an elementary diagram of an encoding and decoding system, the elements thereof being disclosed in additional detail hereinafter. The coding considered is a two-channel correcting (n,k)=(7,3) code. The three parallel data streams are received on the input channels 100. Element 102 is a pre-encoder, wherein each single data stream is divided by the fixed polynominal E that is expressed in the delay operator D. The reason has been discussed herebefore; it should be noted that this division does not modify the data content of the information received, but only the representation thereof. Notably, the pre-encoding does not introduce any redundancy of its own. Element 104 is the encoder, in which the data received is multiplied by the generator matrix [G(D)] to yield redundant data on the seven parallel channels 106. These channels also represent the "medium" (transmission or storage). No further details thereof are given as the required technology may be standard. Thus, on these channels 106 the data may be mutilated to a certain degree. Element 108 represents the read out or reception mechanism which may contain only conventional technology. The heavily drawn outputs therefrom carry all data received on channels 106 and therefore have a data throughput that is (n/k)=7/3 times the data throughput on input 100. Element 110 is a delay generator over a predetermined number of bit cells to be explained hereinafter. Elements 112 through 120 are syndrome generators, each of them implementing one member of the set of secondary parity check matrices [$H_b^o(D)$] as explained here before; these elements all receive identical information from read-out mechanism 108. For a (7, 3) code the required number of syndrome generators (B) is equal to five, for an (8, 4) code this number is equal to six. Every possible combination of two erroneous channels (the maximum number that is simultaneously correctable here) is assigned to at least one syndrome generator (112–120). Syndrome generation is conventionally executed by multiplying the code bit streams by the applicable secondary parity check matrix for comparing the syndrome bit streams to levels indicating correctable errors. The syndrome bit streams have been indicated by double lines. Their data throughput is (n−k)/k times the data throughput on input 100. Elements 122 through 130 are delay shift registers. Elements 132 through 140 are syndrome detectors connected to the delay shift registers for detecting the number of syndrome bit streams (as far as contained in respective shift registers 122 through 130) that contain at least one bit indicating that an error has occurred on channels 106. If this number of syndromes is equal to 2 or less than 2, this would indicate that a correction would probably be feasible (if this number is equal to zero, this would apply to a "dummy" correction) and therefore the corresponding syndrome gate (142 through 150) of four bits wide is opened. It should be noted that an error which would again result in an allowable code sequence would not be detectable or correctable. If the number of syndrome bit streams indicating an error were equal to three or to four (the maximum value), no valid correction could be effected thereby and the corresponding syndrome gate is controlled in the blocking state. The reason could be either that the secondary parity check matrix could not handle the incurred error type, because an error-carrying channel was present outside the subset of channels that could in principle be corrected by the relevant secondary parity check matrix. Alternatively, too many (for example three) error-carrying channels could be present, which is outside the error-correcting capability of the code considered in this example. Then, all gates 142 through 150 should remain blocked. It should be noted that the output of shift register 122 through 130 may be at the end thereof, or alternately, before the end thereof. The number of successive bit stages before the output should be sufficient to cope with the largest delay in bit cells with which an error would be detectable. Element 152 is a cross connection element for routing the syndrome bits to the right channel number: each of the four syndrome bit streams from a respective syndrome gate would correspond to a single one-bit-wide stream of the seven-bit-wide code stream from element 110. If a syndrome bit "0" were to indicate "no error" each of seven output channels of cross-connection element 152 were to be fed by a multi-input OR-gate not shown connected to the outputs of elements 142 through 150 (20 outputs in total) relating to the corresponding code bit stream. The output data path of cross-connection element 152 is seven (n) bits wide. Element 154 is a correction element. The corresponding code bits and correction bits are added modulo-2 for restoring the original data. The delay incurred by element 110 is exactly equal (in number of bit-cells) to the mutually equal delay times incurred in elements 112 through 152. Element 156 receives the seven corrected data bit streams, which in this example are considered to represent a systematic redundant code. Outputs 158 thereby carry the originally received message of inputs 100. The four bit wide data streams on output 160 contain only redundant information and may be ignored.

DESCRIPTION OF A PREFERRED ENCODER DEVICE

Figure 4:
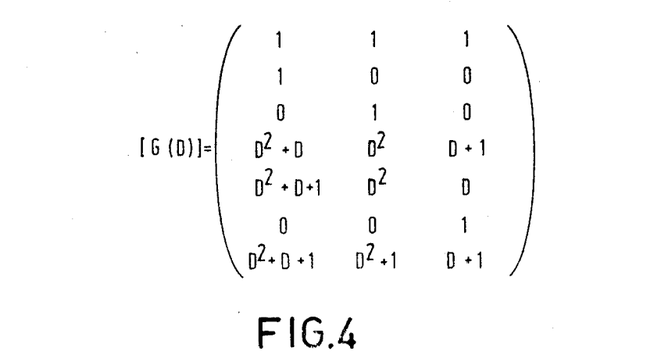
FIG. 4 shows a generator matrix for a (7,3) code.
Figure 5:
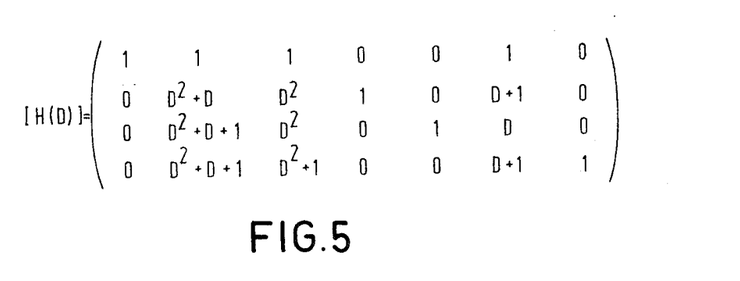
FIG. 5 shows a corresponding parity check matrix.
Figure 6:
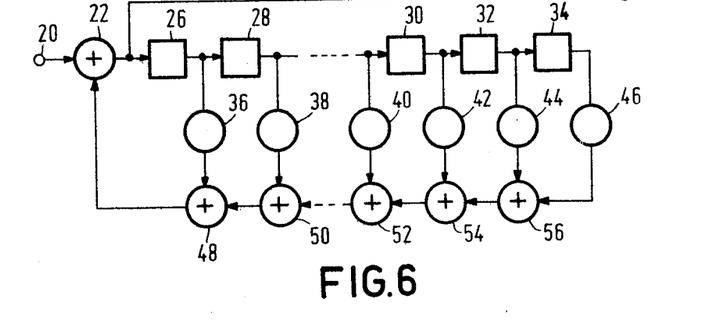
FIG. 6 shows a dividing device for the input data stream.

FIG. 4 shows a code generator matrix for a (7, 3) convolutional code. The corresponding parity check matrix [H(D)] is shown in FIG. 5. FIG. 6 shows a device for dividing a single stream of input data bits by the polynominal E(D) defined hereabove. The relevant polynominal is:

$$E(D) = D^{-f} \cdot a_L(D) = 1 + \sum_{i=1}^{m} a_i \cdot D^i.$$

(wherein $a_i$ is an element of GF(2)).

Figure 7:
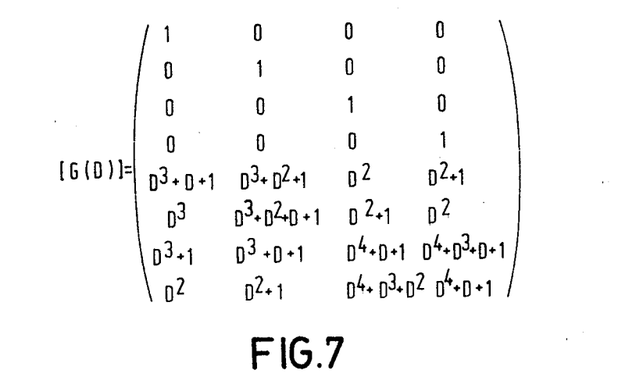
FIG. 7 shows a generator matrix for an (8,4) code.
Figure 8:
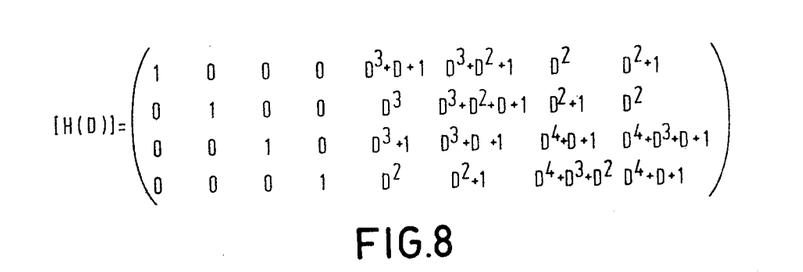
FIG. 8 shows the corresponding parity check matrix.
Figure 9:
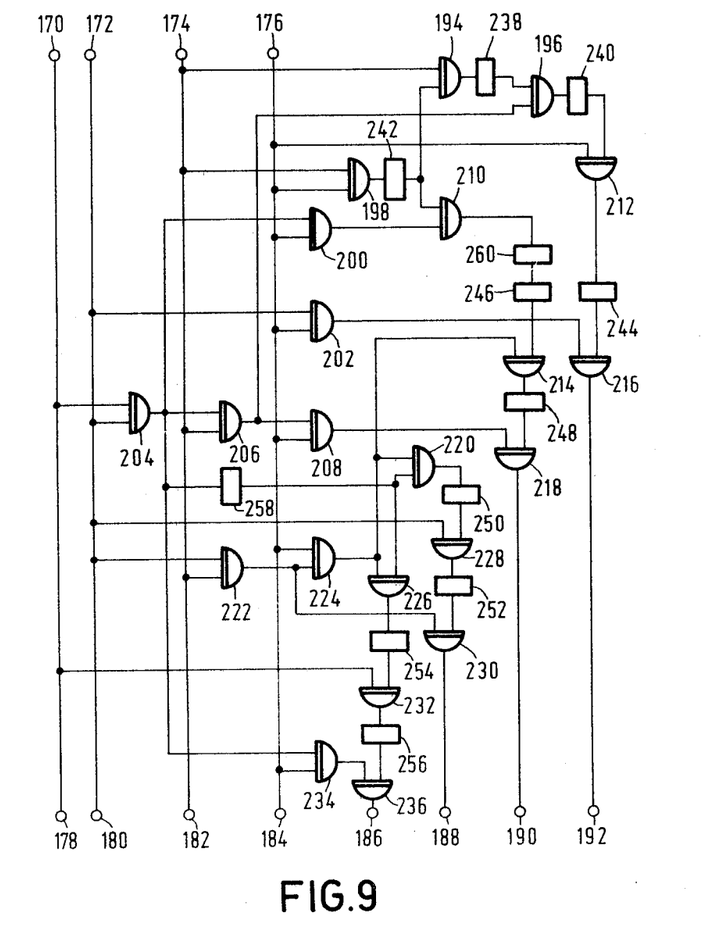
FIG. 9 shows the corresponding encoder device.

The data input stream of one bit wide arrives on input 20. Modification is effected by means of EXCLUSIVE-OR gate 22, whereafter the data is forwarded to output 24. A shift register of w bits length is present (stages 26, 28, 30, 32, 34 being shown by way of example). Six tap elements 36 through 46 have been shown for respectively realizing the coefficients $a_1, a_2, \ldots a_{w-3}, a_{w-2}, a_{w-1}, a_w$. For a coefficient equal to zero, the corresponding tap means is non-existent, or effectively blocked. The output signals of all tap elements are added-modulo-2 by means of EXCLUSIVE-OR-gates 48 through 56 for generating a modifying signal for EXCLUSIVE-OR-gate 22. The clock means for shifting the data and for synchronizing the arithmetic operations, as far as necessary, have not been shown for the sake of brevity. An alternative to the tap-means-with-delay means solution shown would be by means of a preprogrammed read-only memory. FIG. 7 shows a code generator matrix for an (8, 4) convolutional code for which the value of polynominal E is 1. FIG. 8 shows the corresponding parity check matrix. FIG. 9 shows an encoder device for the relevant code. The encoding device comprises four data inputs (170 through 176) for receiving in each clock cycle a data word of four bits. Eight data outputs (178 through 192) have been provided for in each clock cycle outputting a code word having redundancy. The encoding is executed by means of twenty-two EXCLUSIVE-OR gates 194 through 236 and twelve delay elements 238 through 258 for each delaying one data bit by one clock period. The clock means have not been indicated for clarity. Now, each column in FIG. 7 relates to a single input channel and each row to one output channel. The first column relates to input 170, and so on. The first row relates output 178, and so on. Gates 204, 236 generate the three terms "1" on row #5. Gate 232 and delay element 256 generate the single term D on row #5. Gates 222, 224, 226 and delay element 254 generate the three terms $D^2$ on row #5. Gate 204 and delay elements 258 generate the two terms $D^3$ on row #5. The further matrix rows are generated in corresponding manner.

Several gates and delay elements have been used for implementing more than one element of the generator matrix. On the other hand, still further reduction in the gate count could be produced, for example, by combining gates 198 and 234. Taken separately, the producing of matrix multiplication by delay means, tap means and modulo-2 addition is conventional.

DESCRIPTION OF A PREFERRED DECODER DEVICE WITHOUT USE OF FEEDBACK

Figure 10:
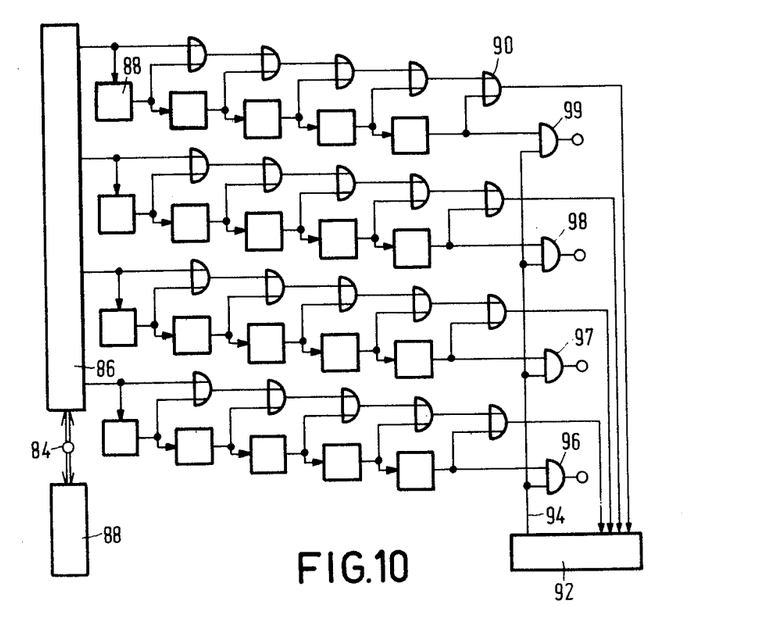
FIG. 10 shows a syndrome discriminator and selector for use with FIGS. 7-9.
Figure 12:
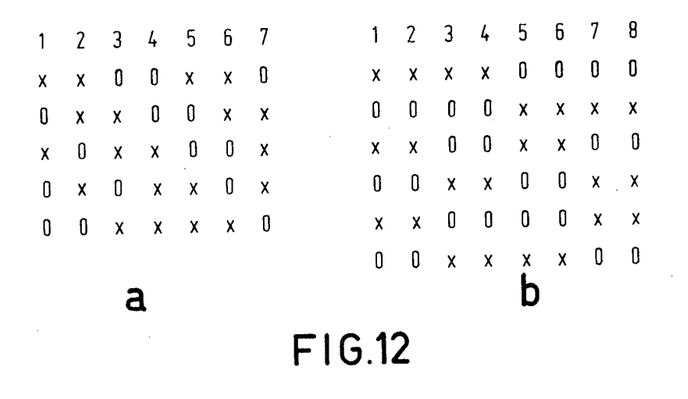
FIGS. 12a, 12b illustrate the determination of the necessary selection among the possible sets of syndrome matrices.

FIG. 10 shows a part of a preferred decoder device for use with an (n,k)=(7,3) code and with the system described with respect to FIGS. 7-9. The encoded data streams are received on seven-fold input 84 and distributed among a plurality of syndrome generators of which only two (86, 88) are shown: these will implement the respective matrices $H_b(D)$. The number of syndrome generators that is necessary is explained with respect to FIG. 12a. Here, each row represents a respective syndrome generator that would implement a multiplication by a corresponding secondary parity check matrix. Each of n columns represents a code bit channel. Now, on each respective row a cross indicates a channel that may contain an error that would be correctable. There are (n−k)=4 such channels on each row. The further channels are indicated by circles. If an error were to occur in one (or more) of such further channels, the syndrome generated by the relevant syndrome generator would report an incorrectable situation (in similar way as when three or more channels, corresponding to the crosses on that row, had errors: then the weight of the syndrome sequence, defined earlier, becomes larger than two). Whereas the code used here allows for simultaneously correcting two channels, the syndrome generator of the first line in FIG. 12a alone is sufficient for correcting the following channel pairs, ½, 1/5, 1/6, 2/5, 2/6, 5/6. The further four syndrome generators would each allow for correcting a different group of channels. Each possible pair of channels is covered by at least one row of FIG. 12a, and hence, by at least one syndrome generator: the pair 4/5 is contained in both the fourth and the fifth rows. The combination of FIG. 12a is only an example of six possible groups; no better combination has been found in this particular case. Thus the number of syndrome generators B=5 is a minimum here.

Figure 11:
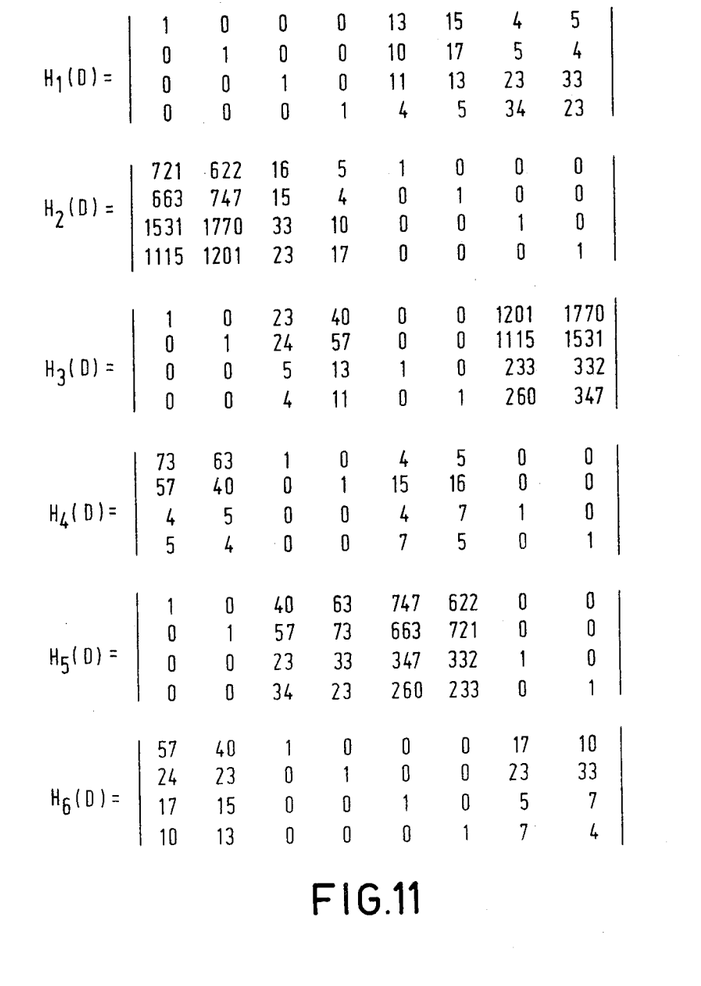
FIG. 11 shows the corresponding syndrome generating matrices [$H_B(D)$]

FIGS. 11, 12b relate to an (n,k)=(8,4) code. FIG. 11 gives the number of B=6 secondary parity check matrices to be implemented by the corresponding syndrome generators. FIG. 12b in similar way illustrates that six syndrome generators are sufficient to correct any possible pair of erroneous channels. The elements of the matrices in FIG. 11 are again polynominals, but they have been symbolized by means of the representation of their coefficients as a number of one or more octal digits as explained earlier. Note that in these matrices $H_b(D)$ columns having only a single non-zero element relate to channels that are not correctable by using the corresponding secondary parity check matrix; columns in FIG. 11 having more than one non-zero entry relate to correctable channels. If in this case only a selection of all possible channel pairs need be corrected only a selection of the rows of FIG. 12b and the corresponding matrices of FIG. 11 is sufficient. The latter property only applies the sets of matrices $[H_b(D)]$ that have "single-1-term-only" columns for the (n-t) channels supposed to be correct. Thus, for $[H_2(D)]$ channels 1 through 4 are considered correct; channels 5 through 8 may be faulty (for valid correction at the most two thereof could actually contain an error within the interval of time wherein correction should take place). The omission of certain syndrome generators would in certain cases, however, endanger the detection of incorrectable situations. FIG. 10 furthermore shows a syndrome detector more in detail. Element 86 is a syndrome generator, for example, corresponding to element 112 in FIG. 3. The syndrome bit stream has a bit width of (n−k)=4 bits. Each of the data streams is temporarily stored in a shift register, of which only five bit stages have been indicated. In practice, the shift register length would be enhanced. Generally, each additional stage added to these shift registers would decrease the probability that an error sequence would be considered as a "correct" sequence. This effect is caused by the phenomenon that an error burst would produce syndrome bits "zero" with a probability of ½. Thus in principle, any length of zero syndrome bits could in principle occur, whereby no correction would be effected. However, the probability that the decoder would "overlook" a burst would decrease exponentially with increasing length of the shift register. The shift register stages have been indicated by squares such as stage 88. The contents of each separate one-bit-wide data stream are ORED. To this effect, the example shows a series of OR-gates for each syndrome bit channel, such as OR-gate 90. The output signal of OR-gate 90 therefore signals whether at least one of a succession of six syndrome bits is non-zero and would therefore signal an error. Syndrome threshold element 92 therefore receives four syndrome detection signals in parallel. This element 92 contains a, possibly conventional, discriminator for enumerating the number of non-zero signals received from the respective OR-gate chains. If this number is more than t, the maximum number of simultaneously correctable channels here, t=(n−k/2)=2), the output of syndrome generator 86 is not useful for further processing. If this number is at most equal to "t", syndrome detector 92 generates a "1" signal on line 94, whereby AND-gates such as AND-gate 96 are rendered transmitting. Thus syndrome gates 142 through 150 would be transmitting. If a correctable error (one or two channels) occurs, only the gates of those elements, the secondary parity check matrix whereof would cover that specific error or combination of errors, would be transmitting. Alternatively "incorrectable" errors may occur, or more specifically, a detectable uncorrectable error. In case more than t channels provide incorrect data, in principle always the possibility exists that the received code sequence is treated as a sequence containing a correctable error, or even as a correct code sequence. Such undetectable errors will not be considered. Generally many error classes will be correctable by the redundant coding system described here. Now, if a (detectable) uncorrectable error occurs, the gates of all elements 142 through 150 would remain blocked and no correction would be made. If required, this "all blocked" situation could be signalled by AND-ing a blocking output signal from element 92 and corresponding elements in other syndrome detectors as an "unreliable data" signal.

The outputs of syndrome gates 142 through 150 are connected to cross connection element 152 in FIG. 3. Thus the setup of FIG. 3 comprises no feedback loop. Therefore, the effect of a non-correctable error would terminate quite soon after the end of this non-correctable error: in fact it would not be corrected at all.

An interesting property of the algorithm illustrated by the matrices of FIG. 11 is that here no preencoder is required because the division by $[R_b(D)]$ yields no fractional matrix elements. The example of the $(n,k)=(7,3)$ code would require a preencoder.

THE DECODER WITH FEEDBACK

Figure 13:
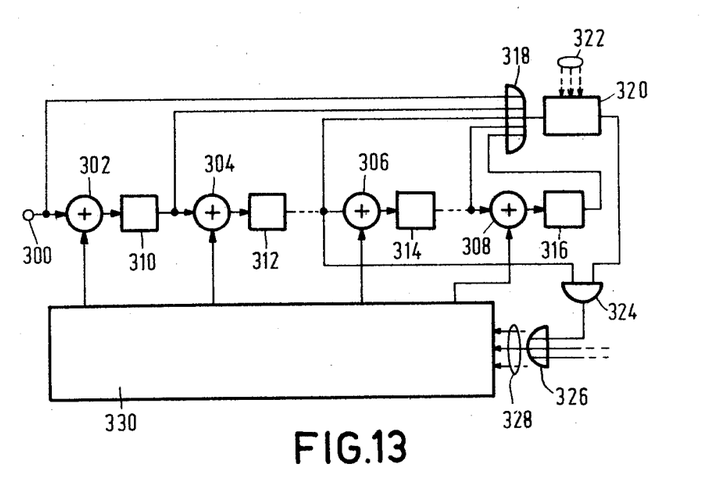
FIG. 13 shows a syndrome resetting device in the feedback decoder.

Alternatively a feedback mechanism may be introduced into the decoder. This may be done in two circumstances. If the division by the matrices $[R_b(D)]$ would produce fractional matrix elements, as with the (7,3) code described herebefore, the use of feedback in the decoder may obviate the need for the preencoder 102 in FIG. 3. Furthermore, independent of the consequences of the division by matrices $[R_b(D)]$ the length of the shift registers 122 through 130 may be diminished, because the probability that a burst error would go undetected is greatly diminished; this applies because any modification by the syndrome streams is also used directly to update the remainder of the syndrome. This favorable property applies in all cases, thus, in the examples disclosed, both for the (7,3) and for the (8,4) codes. Now, each correction made is also used to update the syndrome bit streams by means of a syndrome resetting device shown in FIG. 13; the syndrome updating is in fact based on the same secondary parity check matrix as the syndrome generating. Input 300 is connected to the output of one of elements 112 through 120 in FIG. 3. (only a one bit wide syndrome stream is shown in FIG. 13). The syndrome shift register is built up from stages 310 through 316, each of which is preceded by an EXCLUSIVE-OR gate 302 through 308. Reference is also had to earlier FIG. 10 which shows the syndrome generator and the $(n-k)$-bit wide syndrome shift register-with-detector connected thereto. The output of OR-gate 318 functionally corresponds to the output of OR-gate 90 for signalling at least one non-zero syndrome bit in a sequence of syndrome bits. Element 320 corresponds to element 142 in FIG. 3 and receives on inputs 322 the output signals of other OR-gates than OR-gate 318.

If the syndrome generation/detection were organized according to FIG. 10, syndrome detector 320 of FIG. 13 would have four inputs 322. AND-gate 324 corresponds to a syndrome blocking gate (e.g. AND-gate 99) in FIG. 10 and is controlled in gating manner only when element 320 detects at the most t non-zero syndrome bit streams. Note that AND-gate 324 is connected to the output of an intermediate shift register stage which is one of two possible alternatives as was explained earlier. OR-gate 326 serves for combining the syndrome bits corresponding to a specific data channel. Referring to FIGS 3 and 12a, elements 112 through 120 correspond to the five lines of crosses and circles in this order. Thus, the four syndrome bit streams from element 112 correspond to columns 1, 2, 5, 6 respectively. Syndrome bit streams from element 114 correspond to column 2, 3, 6, 7, respectively. Thus in OR-gate 326, for example, the second syndrome bit stream of element 112 is OR-ed with the first syndrome bit stream of element 114. Thus OR-gate 326 receives the same input information as one of the OR-gates of cross-connection element 152 in FIG. 3. Syndrome corrector 330 receives all output data corresponding to the output data of cross-connection element 152 (seven bits wide) and implements the same secondary parity check matrix as implemented (by matrix multiplication) in the syndrome generator of syndrome generators 112 through 120 to which output 300 is connected. The decoding now is done as follows. Next to the formation of the syndromes (FIG. 3 blocks 112 through 120) in block 110 furthermore the received code sequence is multiplied by the polynominal E(D). In the case of the exemplary (8,4) code this step may be omitted because now only the shortened length of the syndrome shift registers is reached. In block 102 the k-bit wide data stream had been divided by this polynominal, while furthermore, the syndrome generator (blocks 112 through 120) represents an implied multiplication by this same polynominal.

The syndromes are formed in the same way as described earlier. The syndrome registers (FIG. 13, elements 310 through 316) have a bit length N which is equal to, or slightly higher than, the highest degree of all polynominals in $H_{1..B}(D)$; the latter quantity in FIG. 11 is equal to 10 (1770 = 1111 111 000).

Figure 14:
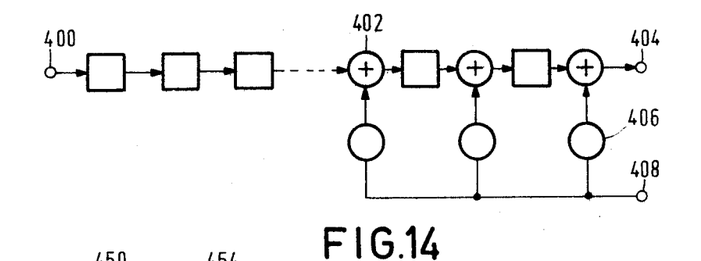
FIG. 14 shows an error correcting device for use in the feedback decoder.

FIG. 14 illustrates the correction procedure in the feedback decoder. The squares again are one-bit delay elements or shift register stages. On input 400 the code bit sequence arrives, after the measures taken in block 110 (FIG. 3). Only a one-bit-wide bit stream has been shown for simplification (in FIG. 3 the correction quantities are produced at the output of cross-connection element 152 and have a width of seven bits). Now, in FIG. 14, the division process is effected inherently together with the correction. This is necessary because without element 102 present the syndrome generation introduces a multiplication by the polynominal E(D) mentioned earlier. Thus, while input 408 receives the correction value proper, the division may be effected by a plurality of tap means (406 . . . ) wherein the tap coefficients (1 or 0) correspond exactly to those introduced by elements 36 through 46 in FIG. 6. In this way the corrected bits (n-bits wide) are generated on output 408 and corresponding outputs for the further bit sequences.

Figure 15:
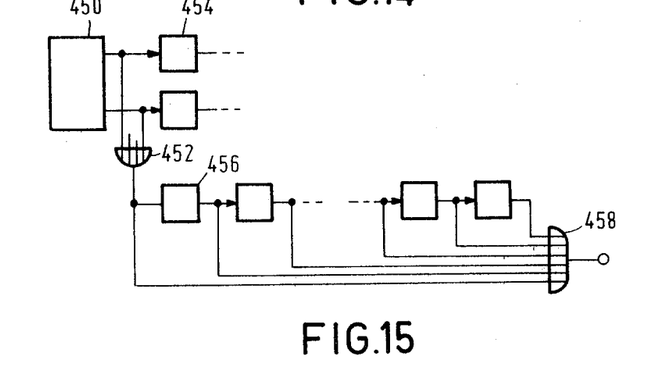
FIG. 15 shows a second syndrome resetting device in the feedback decoder to avoid error propagation.

FIG. 15 shows a syndrome resetting device for resetting all syndromes to zero in the feedback decoder to avoid error propagation. Element 450 is a syndrome generating device, such as one of the blocks 112 through 120 in FIG. 3. The $(n-k)$ syndrome bits are OR-ed in OR-gate 452. Note the difference with FIG. 10: there the OR-function (OR-gate 90) is effected along one syndrome bit stream, while in FIG. 15 the OR-function is produced across the $(n-k)$ syndrome bits. Blocks, like block 454 again symbolize the syndrome register. The result from OR-gate 452 is temporarily stored in a shift register formed from stages like block 456. The contents thereof are OR-ed by OR-gate 458. Now, if uncorrectable errors occur and these are followed after some time by error-free code sequences, the outputs of the syndrome generators (112 through 120) after some delay become zero, but the feedback-construction in the syndrome registers has the consequence that a non-zero content may continuously be present thereafter in those syndrome registers. Now the length of the register containing stage 456 is at least N bits. The output signal, when zero, of OR-gate 458 is used to reset all syndrome shift registers to zero. The arrangement of FIG. 15 is present only once (in FIG. 3, therefore, not five times).

The precoding operation can be omitted (FIG. 6), if the correction is effected as shown in FIG. 14. The probability of false resetting is again a geometrically decreasing function from the register length. The resetting connection is a conventional means and has not been shown for brevity.

Now, in the above, a two-channel-error correcting code (t=2) was developed by using minimum distance separable codes, the latter being operative for correcting symbols. In like way, other plural channel error correcting codes (t=3,4, . . . ) may be developed by starting from minimum distance separable codes with corresponding extended error correcting capability. Effectively, in itself such more powerful m.d.s. codes are known, while the above disclosure gives the derivation for developing the plural channel error correcting codes therefrom.

What is claimed is:

1. A system for introducing redundant binary data in a plurality of $n \geq 6$ parallel one bit wide streams (106) into a medium and for extracting those binary data again therefrom while correcting for at most $t \geq 2$ simultaneously erroneous ones of said serial streams, said system comprising:

a plurality of $k \geq 2$ data inputs (100) for receiving in parallel successive groups of k input data bits each;

an encoding device (104) comprising first multiplication means for multiplying the k streams of data bits with a generator matrix [G(D)] of n rows by k columns, consisting of a (kxk) identity matrix and an (n−k)xk additional matrix, wherein all elements of [G(D)] are polynomials in D, the delay operator of a length of one bit cell, and are elements of a field F(D) consisting of all Laurent series having coefficients $a_i$, and wherein all elements of the additional matrix are non-zero and at least one thereof is a polynomial with at least two terms; wherein the generator matrix [G(D)] is given by an (nxk) generator matrix of a minimum distance separable symbol correcting code defined in a Galois field GF($2^m$) in that the coefficients of the polynomial elements in [G(D)] are the binary elements of the binary representation of the corresponding elements $a_i$ of the Galois field GP($2^m$) of the generator matrix of the minimum distance separable code, wherein $2^m \geq n-1$ and $a_i$ is an element of GF($2^m$); said encoding device having n outputs for, in synchronism with the reception of a group of k data bits, outputting a corresponding group having k unmodified data bits together with (n−k) redundant code bits to said medium;

a decoding device for implementing a parity check matrix [H(D)] given by [G(D)]·[H(D)]=0 when all operations are executed in the field F(D), said decoding device comprising:

a plurality of B decoder modules (112–120) each having respective second multiplication means for receiving said groups of n code bits in parallel for multiplying the received code bit streams by a respective secondary parity check matrix $[H_{1..b..B}(D)]$ of (n−k) rows by n columns, the result of each multiplication consisting in (n−k) parallel streams of syndrome bits, each of said (n−k) streams indicating a preliminary correction bit stream to an associated code bit channel while also corresponding to a respective one of the (n−k) rows, wherein the derivation of $[H_{1..b..B}(D)]$ from [H(D)] is done as follows:

i. a set of B second elements is formed, each second element consisting of 2t channel indices, each combination of t channel indices being contained in at least one of said elements;

ii. for each of said second elements a first intermediate matrix is formed $[R_{1..b..B}(D)]$ consisting of only those columns of [H(D)] that have indices equal to respective indices of code channels contained in said element;

iii. for each of said second elements a second intermediate matrix $[H_{1..b..B}(D)]$ is formed by:

$[H_{1..b..B}(D)] = [R_{1..b..B}(D)]^{-1}[H(D)]$ iv. for each of said second elements a matrix $[H_{1..b..B}(D)]$ is formed by:

$[H_{1..b..B}(D)] = a_L(D)[H_{1..b..B}(D)]$, wherein $a_L(D)$ is the smallest common multiple of all the denominators of all matrix elements of all matrices $[H_{1..b..B}(D)]$, written as $a_L(D) = D^{-f} \cdot E(D)$ wherein f is the lowest power in D of $a_L(D)$ having a non-zero coefficient;

for each of said B decoder modules, a shift register module (122–130) of (n−k) bits wide for receiving said syndrome bit streams and storing a predetermined sequence length thereof;

for each of said shift register modules, a syndrome detector (132–140) for detecting and enumerating any non-zero syndrome bit sequence in the corresponding shift register and producing a gating signal under control of detection of (o . . . t) non-zero syndrome bit sequences but otherwise a blocking signal;

connected to an output of each of said shift register modules, an (n−k) bit wide syndrome gate (142–150) that is transmitting exclusively under control of the gating signal from the associated syndrome detector, but otherwise blocked;

a cross-connection device (152) for sorting the syndrome bit streams transmitted through said syndrome gates according to the corresponding one of said n code bit channels;

delay means together with third multiplying means (110) connected in parallel to said B decoder modules for receiving at least the non-redundant code bit streams from the medium and for introducing a delay that is equal to the delay incurred in said decoder modules and said shift register modules while also effecting a multiplication by the polynomial E(D);

EXCLUSIVE-OR means (154) connected to outputs of said cross-connection device and of said delay means together with third multiplying means for correcting at least the non-redundant code bit streams with non-zero syndrome bit streams, and outputting the corrected code bit streams.

2. A system as claimed in claim 1, wherein, in case the polynominal E(D) comprises more than one term, a preencoding device (102) is present having k preencoding modules with dividing means each having an input connected to a respective one of said k data inputs for dividing the respective one-bit data streams by the polynominal E(D), said preencoding device having k outputs connected to respective inputs of said encoding device for forwarding thereto modified data bit streams instead of data bit streams received on said data inputs.

3. A system as claimed in claim 1, wherein $k \geq 3$ and $n \geq 7$.

4. A system for introducing redundant binary data in a plurality of $n \geq 6$ parallel one bit wide streams (106) into a medium and for extracting those binary data again therefrom while correcting for at most $t \geq 2$ simultaneously erroneous ones of said serial streams, said system comprising:

a plurality of $k \geq 2$ data inputs (100) for receiving in parallel successive groups of k input data bits each;

an encoding device (104) comprising first multiplication means for multiplying the k streams of data bits with a generator matrix [G(D)] of n rows by k columns, consisting of a (kxk) identity matrix and an (n−k)xk additional matrix, wherein all elements of [G(D)] are polynomials in D, the delay operator of a length of one bit cell, and are elements of a field F(D) consisting of all Laurent series having coefficients $a_i$, and wherein all elements of the additional matrix are non-zero and at least one thereof is a polynomial with at least two terms; wherein the generator matrix [G(D)] is given by an (nxk) generator matrix of a minimum distance separable symbol correcting code defined in a Galois field $GF(2^m)$ in that the coefficients of the polynomial elements in [G(D)] are the binary elements of the binary representation of the corresponding elements $a_i$ of the Galois field $GF(2^m)$ of the generator matrix of the minimum distance separable code, wherein $2^m \geq n-1$ and $a_i$ is an element of $GF(2^m)$; said encoding device having n outputs for, in synchronism with the reception of a group of k data bits, outputting a corresponding group having k unmodified data bits together with (n−k) redundant code bits to said medium;

a decoding device for implementing a parity check matrix H(D) given by $[G(D)]\cdot[H(D)]=0$ when all operations are executed in the field F(D), said decoding device comprising:

a plurality of B decoder modules, each have respective second multiplication means for receiving said groups of n code bits in parallel for multiplying the received code bit stream by a respective secondary parity check matrix $[H_{1..b..B}(D)]$ of (n−k) rows by n-columns, the result of each multiplication consisting of (n−k) parallel streams of syndrome bits, each of said (n−k) streams indicating a preliminary correction bit stream to an associated code bit channel while also corresponding to a respective one of the (n−k) rows, wherein the derivation of $[H_{1..b..B}(D)]$ from [H(D)] is done as follows:

a set of B second elements is formed, each second element consisting of 2t channel indices, each combination of t channel indices being contained in at least one of said elements;

for each of said second elements a first intermediate matrix is formed $[R_{1..b..B}(D)]$ consisting of only those columns of H(D) that have indices equal to respective indices of code channels contained in said elements; for each of said second elements a second intermediate matrix $[H_{1..b..B}(D)]$ i formed by:

$[H_{1..b..B}(D)] = (R_{1..b..B})^{-1}[H(D)]$ for each of said second elements a matrix $[H_{1..b..B}(D)]$ is formed by:

$[H_{1..b..B}(D)] = a_1(D)[H_{1..b..B}(D)],$ wherein $a_L(D)$ is the smallest common multiple of all the denominators of all matrix elements of all matrices $[H_{1..b..B}(D)]$, written as $a_1(D) = D^{-f} \cdot E(D)$, wherein f is the lowest power in D of $a_1(D)$ having a non-zero coefficient;

for each of said B decoder modules a shift register module of (n−k) bits wide for receiving said syndrome bit streams and storing a predetermined sequence length thereof;

for each of said shift register modules, a syndrome detector for detecting and enumerating any non-zero syndrome bit sequence in the corresponding shift register and producing a gating signal under control of detection of (o . . . t) non-zero syndrome bit sequences but otherwise a blocking signal;

for at least one of said shift register modules, a second syndrome detector for directly receiving the unmodified syndrome bit groups and detecting any non-zero syndrome bit in any group over a predetermined bit length within said sequence of unmodified syndrome bits and thereupon generating a "proceed" signal but under control of only zero syndrome bit groups within said predetermined length generating a reset signal for resetting to zero all said shift register modules;

connected to an output of each of said shift register modules an (n−k) bit wide syndrome gate that is transmitting exclusively under control of the gating signal from the associated syndrome detector, but otherwise blocked, a cross-connection device for sorting the syndrome bit streams transmitted through said syndrome gates according to the corresponding one of said n code bit channels;

delay means together with third multiplying means connected in parallel to said B decoder modules for receiving at least the non-redundant code bit streams from the medium and for introducing a delay that is equal to the delay incurred in said decoder modules and said shift register modules while also effecting a multiplication by the polynomial E(D);

EXCLUSIVE-OR means connected to outputs of said cross connection device and of said delay means together with third multiplying means for correcting at least the non-redundant code bit streams with non-zero syndrome bit streams, and outputting the corrected code bit streams;

for each of said shift register modules a respective retrocoupling means connected to the output of the corresponding syndrome gate for presenting an (n−k)-bits wide syndrome stream with k-bits wide dummy stream, the latter corresponding to the code bit channels not contained in the relevant element of the set of B elements, to fourth matrix multiplication means for multiplying the syndrome bit streams with dummy bit streams with the relevant secondary parity check matrix $H_b(D)$ and for correcting therewith the syndrome bit stream provided by said second matrix multiplication means.

5. A system as claimed in claim 2 or 4, wherein the relation between the two matrices G(D) and H(D) is given as follows:

$$G(D) = \begin{bmatrix} I_{k \times k} & (D) \\ H^*_{(n-k) \times k} & (D) \end{bmatrix}$$

$$H(D) = [H^*_{(n-k) \times k}(D) : I_{(n-k) \times (n-k)}(D)]$$

wherein I is an identity matrix and [H$^x$..] is an additional matrix of dimensions (n−k)xk.

6. A system as claimed in claim 2 or 4, wherein said cross-connection element consists of n multi-input OR-gates in parallel.

* * * * *